United States Patent [19]

Hirasawa

[11] Patent Number: 5,197,099
[45] Date of Patent: Mar. 23, 1993

[54] MULTIPLE-CHANNEL AUDIO REPRODUCTION APPARATUS

[75] Inventor: Kazuo Hirasawa, Nagaokakyo, Japan

[73] Assignee: Mitsubishi Denki Kabushiki Kaisha, Tokyo, Japan

[21] Appl. No.: 592,777

[22] Filed: Oct. 4, 1990

[30] Foreign Application Priority Data

Oct. 11, 1989 [JP] Japan .................................. 1-264293
Oct. 11, 1989 [JP] Japan .................................. 1-264294

[51] Int. Cl.⁵ ...................... H04R 5/00; H04R 29/00; H03G 3/00; H03F 21/00
[52] U.S. Cl. .................................. 381/27; 381/22; 381/63; 381/59; 381/121
[58] Field of Search .................. 381/27, 28, 22, 80, 381/81, 63, 123, 120, 121, 7, 10, 11, 55, 96, 59, 18, 19, 20, 21, 86, 107

[56] References Cited

U.S. PATENT DOCUMENTS

| | | | |
|---|---|---|---|
| 4,034,158 | 7/1977 | Britton | 381/21 |
| 4,392,019 | 7/1983 | Halliday | 381/19 |
| 4,481,660 | 11/1984 | de Koning et al. | 381/81 |
| 4,887,298 | 12/1989 | Haigler | 381/55 |
| 4,949,384 | 8/1990 | Noro | 381/96 |
| 4,968,154 | 11/1990 | Baeg | 381/18 |
| 5,014,320 | 5/1991 | Nagi | 381/96 |
| 5,034,996 | 7/1991 | Carey et al. | 381/86 |

FOREIGN PATENT DOCUMENTS 1797785 3/1959 Fed. Rep. of Germany .
3734084 10/1987 Fed. Rep. of Germany .

OTHER PUBLICATIONS

"Sound System Suitable for High Definition Television" Kurozumi et al, The Journal of the Institute of Television Engineers of Japan, vol. 42, No. 6, 1988.

Primary Examiner—James L. Dwyer
Assistant Examiner—Jack Chiang

[57] ABSTRACT

A multiple-channel audio reproduction apparatus has an audio demodulator for demodulating an input signal to produce audio signals for multiple channels. One or more signal-processing circuits process audio signals of one or more of these channels in a way suitable for reproduction by loudspeakers connected to other channels. Switches feed the processed audio signals to output terminals for those other channels. A switch controller turns these switches on if a loudspeaker is not connected to the channel corresponding to the original, unprocessed signal, and otherwise turns these switches off.

17 Claims, 5 Drawing Sheets

MULTIPLE-CHANNEL AUDIO REPRODUCTION APPARATUS

BACKGROUND OF THE INVENTION

This invention relates to a multiple-channel audio reproduction apparatus, and more particularly to an apparatus that redistributes audio signals according to the presence or absence of connected loudspeakers.

Multiple-channel audio reproduction apparatus has been used to reproduce the sound tracks of motion pictures in such a way that the listener is surrounded by sound coming from the right, left, in front, and behind. The same type of reproduction can be used with high-definition television (HDTV). A problem is that many audio reproduction systems are equipped to reproduce only the two audio channels employed in conventional stereo recording and broadcasting. Whereas some users of devices such as HDTV tuners may want to equip their systems with additional loudspeakers for four-channel audio reproduction, while others may prefer to continue to use a conventional two-speaker system.

SUMMARY OF THE INVENTION

It is accordingly an object of the present invention to reproduce multiple-channel audio signals through a number of loudspeakers equal to or less than the number of channels.

Another object of the invention is to identify those channels to which loudspeakers are connected, and redistribute the audio signals so that all channels are reproduced.

A multiple-channel audio reproduction apparatus has an audio demodulator for demodulating an input signal to produce audio signals for multiple channels. One or more signal-processing circuits process audio signals of one or more of these channels in a way suitable for reproduction by loudspeakers connected to one or more other channels. Switches feed the processed audio signals to loudspeakers connected to those other channels. Switch controlling means turns these switches on if a loudspeaker is not connected to the channel corresponding to the original, unprocessed signal, and otherwise turns the switches off. The switch controlling means may employ pushbuttons, or it may test the presence of connected loudspeakers at power-up by applying an output-check signal and detecting current flow.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS OF THE PRESENT INVENTION

Figure 1:
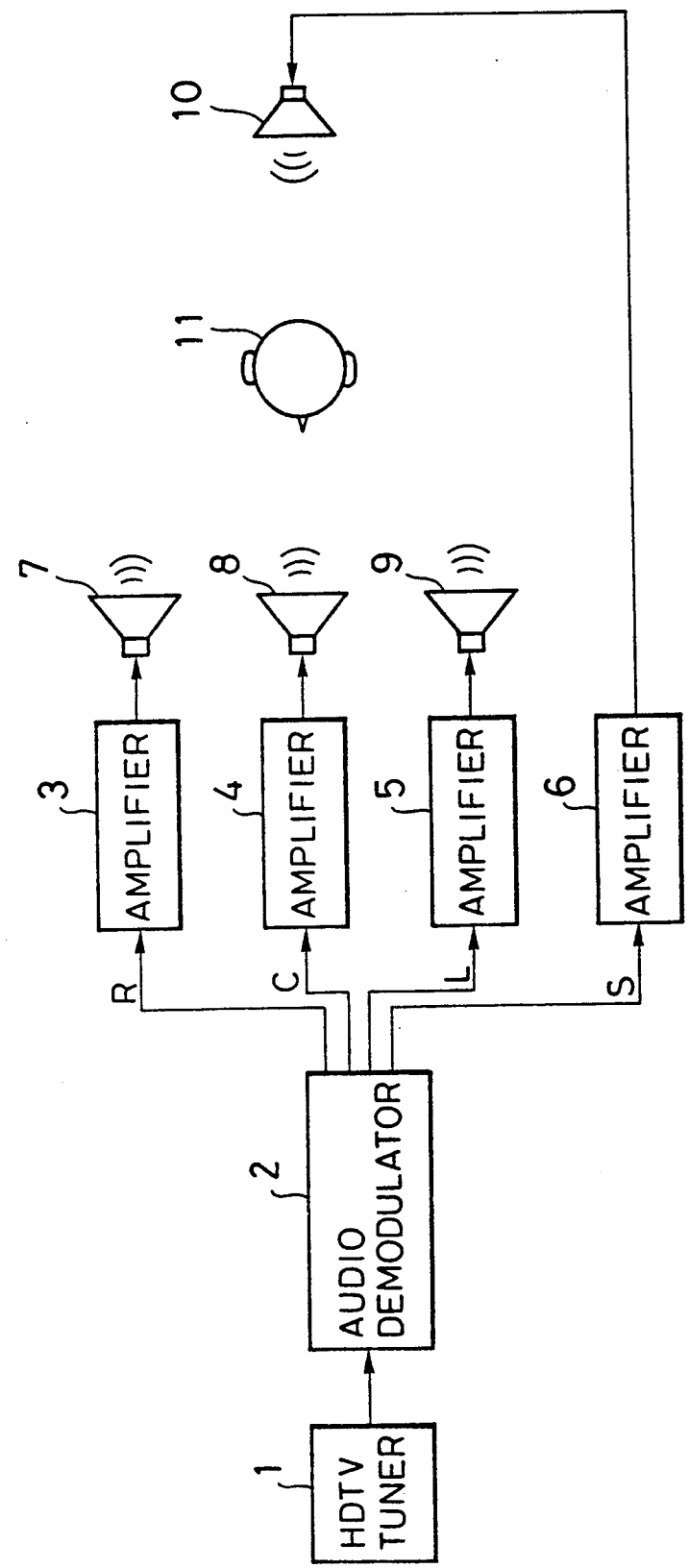
FIG. 1 is a block diagram illustrating reproduction of a four-channel audio signal through four loudspeakers.

FIG. 1 is a block diagram illustrating reproduction of a four-channel audio signal through four loudspeakers. Specifically, it illustrates a four-channel reproduction scheme used for HDTV in Japan. A tuner 1 in the television set receives the broadcast signal, which is demodulated by an audio demodulator 2 to yield four audio signals. These are amplified by amplifiers 3, 4, 5, and 6, reproduced through loudspeakers 7, 8, 9, and 10, and heard by the listener 11. The four audio signals are labeled R, C, L, and S in the drawing, these letters denoting the following audio channel names:

R: right channel
C: center channel
L: left channel
S: surround channel (rear channel)

These four channels create a surrounded effect in which the listener 11 perceives the sound in a highly realistic manner.

Not all broadcasts have four-channel audio; in some cases only two audio channels are used. With reference to Table 1 below, a broadcast may be monaural, in which case an identical signal is broadcast at identical levels on the R-and L-channels, or stereo, in which case conventional stereo signals are broadcast on the R- and L-channels. Another broadcast mode is the monaural+monaural dual mode, in which separate audio signals (monaural-1 and monaural-2) are broadcast on the R- and L-channels. All four channels are used only in the 3-1 audio broadcast mode, this being the only mode that provides the surrounded audio effect.

TABLE 1

| | Audio Channels Used | | | |
|---|---|---|---|---|
| Broadcast Mode | R | L | C | S |
| (1) Monaural | Yes | Yes | No | No |
| (2) Stereo | Yes | Yes | No | No |
| (3) Monaural 1 + monaural 2 | Yes | Yes | No | No |
| (4) 3-1 | Yes | Yes | Yes | Yes |

The multiple-channel audio reproduction apparatus for the embodiments of the present invention will next be described with reference to FIGS. 2 to 6. Two embodiments will be shown, the first embodiment having internal circuits for determining the number of connected loudspeakers, the second embodiment providing pushbuttons for this purpose.

Figure 2:
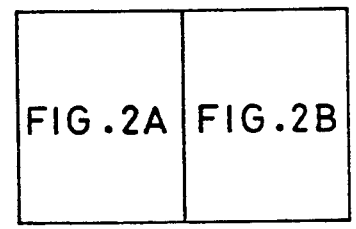
FIGS. 2-2B are a block diagram illustrating a multiple-channel audio reproduction apparatus for a first embodiment of the present invention.
Figure 2A:
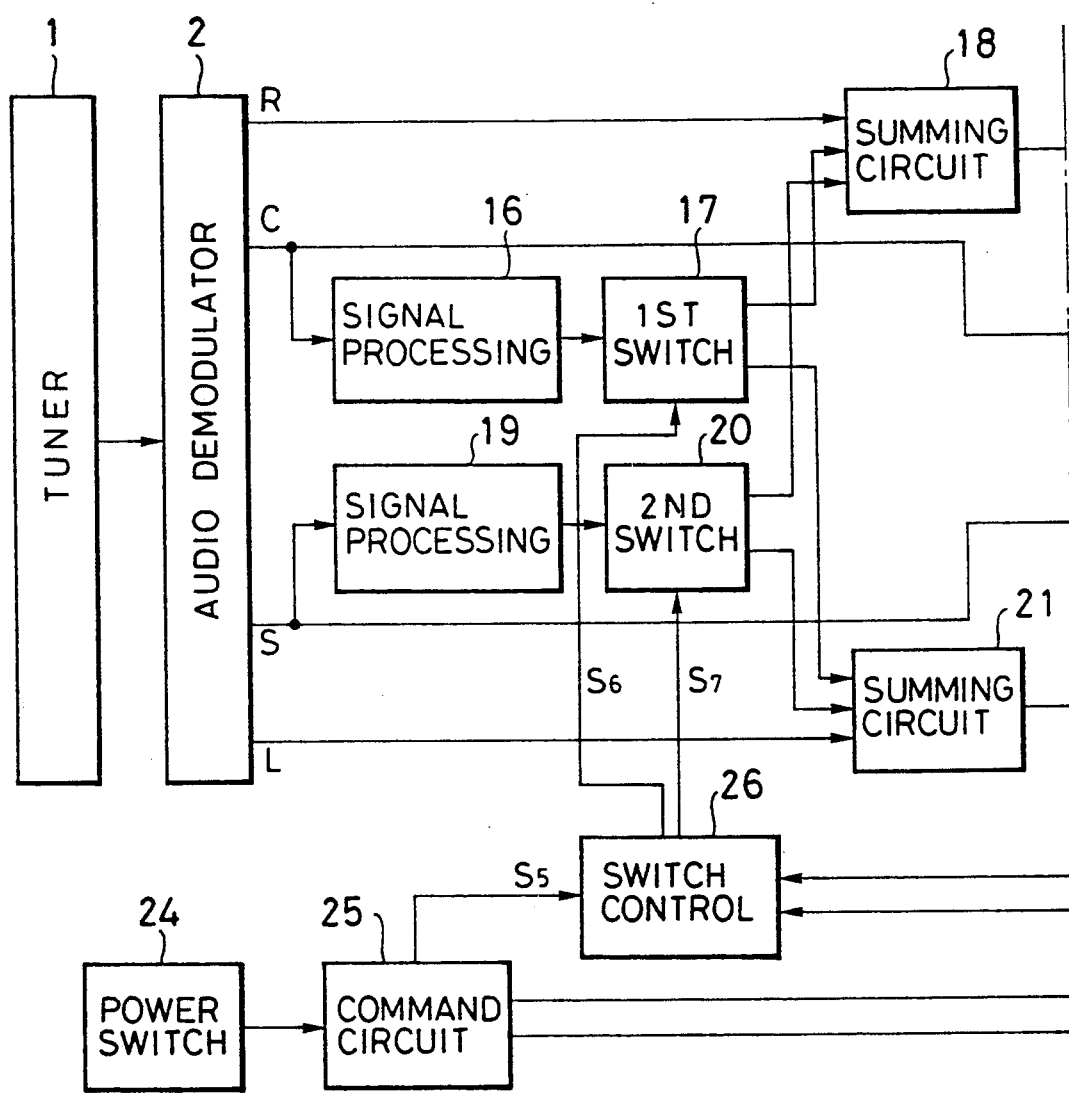
Figure 2B:
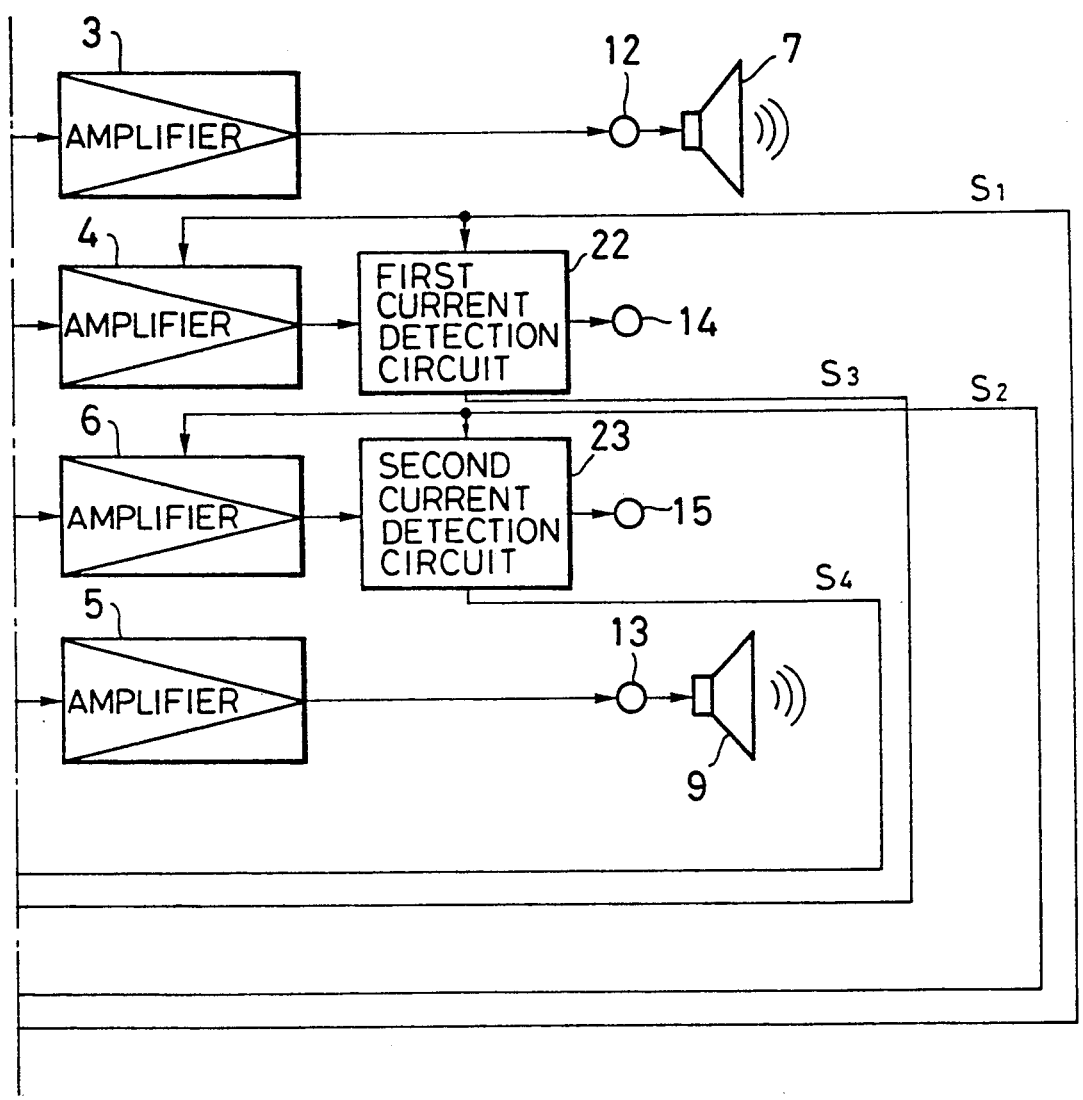

With reference to FIG. 2, the first embodiment includes a tuner 1, an audio demodulator 2, and amplifiers 3, 4, 5, and 6 for amplifying the R, C, L, and S audio signals as in FIG. 1. Each amplifier feeds the amplified audio signal to an output terminal for connection with a loudspeaker. The C-channel amplifier 4 and the S-channel amplifier 6 receive, in addition to the C- and S-channel audio signals, current-check command signals $S_1$ and $S_2$ to which they respond by generating a fixed output-check signal.

In FIG. 1 loudspeakers 7 and 9 are connected to the R-and L-channel output terminals 12 and 13, but no loudspeakers are connected to the C- and S-channel output terminals 14 and 15. That is, the system in FIG. 1 is equipped only with the two loudspeakers used for conventional stereo reproduction.

A first signal-processing circuit 16, a first switch 17, a first summing circuit 18, a second signal-processing circuit 19, a second switch 20, and a second summing circuit 21 are connected between the audio demodulator 2 and the R-and L-channel amplifiers 3 and 5. The R-channel audio signal from the audio demodulator 2 is fed to the first summing circuit 18. The C-channel audio signal from the audio demodulator 2 is fed directly to the C-channel amplifier 4, and also to the first signal-processing circuit 16. The S-channel audio signal from the audio demodulator 2 is fed directly to the S-channel amplifier 6, and also to the second signal-processing circuit 19. The L-channel audio signal from the audio demodulator 2 is fed to the second summing circuit 21.

The first signal-processing circuit 16 processes the C-channel audio signal, in such a way that when the processed signal is reproduced through the right and left loudspeakers 7 and 9, it is perceived as if coming at normal volume from a point midway between these two loudspeakers. For example, the first signal-processing circuit 16 may include an attenuator that attenuates the C-channel audio signal by a factor of $1/\sqrt{2}$. The processed C-channel audio signal output from the first signal-processing circuit 16 is applied to the first switch 17 and fed to both the first summing circuit 18 and the second summing circuit 21 when the first switch 17 is on. When the first switch 17 is off, the processed C-channel audio signal is not fed to either summing circuit.

The second signal-processing circuit 19 processes the S-channel in such a way that when the processed signal is reproduced through the right and left loudspeakers 7 and 9, it is perceived as if coming from behind the listener. This impression can be created by altering the phase and attenuating the level of the S-channel signal appropriately. The second signal-processing circuit 19 may include, for example, a phase inverting circuit and an attenuating circuit. The processed S-channel audio signal output from the second signal-processing circuit 19 is applied to the second switch 20 and fed to both the first summing circuit 18 and the second summing circuit 21 when the second switch 20 is on. When the second switch 20 is off, the processed S-channel audio signal is not fed to either summing circuit.

The output of the first summing circuit 18, including the R-channel audio signal and possibly the processed C- and S-channel audio signals, is fed to the input of the R-channel amplifier 3. The output of the second summing circuit 21, including the L-channel audio signal and possibly the processed C- and S-channel audio signals, is fed to the input of the L-channel amplifier 5.

The multiple-channel audio reproduction apparatus in FIG. 2 also has a switch controller for controlling the first and second switches 17 and 20. The switch controlling controller includes first and second signal-generators for sending respective output-check signals to the C-channel and S-channel output terminals 14 and 15. In this apparatus the first and second signal generators are simply the C- and S-channel amplifiers 4 and 6, which generate output-check signals in response to current-check command signals $S_1$ and $S_2$ as already described.

The switch controller also includes a first current detection circuit 22 connected between the C-channel amplifier 4 and the C-channel output terminal 14, and a second current detection circuit 23 connected between the S-channel amplifier 6 and the S-channel output terminal 15. These current detection circuits also receive the current-check command signals $S_1$ and $S_2$, and produce output signals $S_3$ and $S_4$ indicating the presence or absence of current flow between respective amplifiers 4 and 6 and output terminals 14 and 15. The detection threshold is set so as to detect, for example, a flow of current that would be induced to an eight-ohm loudspeaker load by the output-check signals from the amplifiers 4 and 6.

The entire apparatus is switched on and off by a power switch 24. The switch controller also includes a current-check command circuit 25 connected to the power switch 24, the first current-detection circuit 22, and the second current-detection circuit 23. When power is switched on, the current-check command circuit 25 sends current-check command signals $S_1$ and $S_2$ to the C-channel amplifier 4, the first current-detection circuit 22, the S-channel amplifier 6, and the second current-detection circuit 23 for an interval of time T. The current-check command signals can be generated by a monostable multivibrator, for example, in the current-check command circuit 25.

The switch controller further includes a switch control circuit 26 that is activated by a current-check command signal $S_5$ from the current-check command circuit 25. When activated, the switch control circuit 26 receives the output signals $S_3$ and $S_4$ from the first current-detection circuit 22 and the second current-detection circuit 23 indicating the presence or absence of current flow, and controls the first and second switches 17 and 20 accordingly by means of signals $S_6$ and $S_7$.

Next the operation of the apparatus in FIG. 2 will be described for various broadcast modes.

When power is first switched on, the power switch 24 activates the current-check command circuit 25, causing it to produce current-check command signals $S_1$, $S_2$, and $S_5$ for the interval of time T. The C-channel and S-channel amplifiers 4 and 6 respond by generating output-check signals during the interval T. Since no loudspeaker is connected to the output terminal 14 or the output terminal 15, the outputs $S_3$ and $S_4$ of the first and second current-detection circuits 22 and 23 report the absence of current flow. Responding to these outputs, the switch control circuit 26 turns both the first switch 17 and the second switch 20 on, feeding the processed C-channel and S-channel audio signals to the first summing circuit 18 and the second summing circuit 21.

After the time interval T, the current-check command circuit 25 ceases sending current-check command signals $S_1$, $S_2$, and $S_5$, so the C-channel and S-channel amplifiers 4 and 6 revert to normal operation. When the current-check command signal $S_5$ cuts off, the switch control circuit 26 locks the signals $S_6$ and $S_7$ in their current state, thus holding the first and second switches 17 and 20 in the on-state.

In a monaural broadcast, a dual monaural broadcast, or a stereo broadcast, only the R-channel and L-channel audio signals are present. These are fed through the first and second summing circuits 18 and 21 to the R-channel and L-channel amplifiers 3 and 5, respectively, and reproduced through the right and left loudspeakers 7 and 9. The sound heard from the right and left loudspeakers includes pure R-channel and L-channel audio; no C-channel and S-channel audio signals are output from the audio demodulator 2.

In a 3-1 broadcast, the R-channel and L-channel audio signals are heard from the right and left loudspeakers 7 and 9 as before. The C-channel audio signal is heard from both the right and left loudspeakers 7 and 9, having been processed by the first signal-processing circuit 16 so that it appears to come from a point midway between these two loudspeakers in front of the listener. Similarly, the S-channel audio signal is heard from both the right and left loudspeakers 7 and 9, having been processed by the second signal-processing circuit 19 so that it appears to come from a point behind the listener. The listener thus experiences a surrounded sensation even though all the sound is produced by only two loudspeakers.

If a loudspeaker were connected to the C-channel output terminal 14, the first current-detection circuit 22 would detect current flow during the interval T and the switch control circuit 26 would turn the first switch 17 off. In this case the C-channel audio signal in the 3-1 broadcast mode would be reproduced through the loudspeaker connected to the C-channel output terminal 14 and not through the right and left loudspeakers 7 and 9. Similarly, if a loudspeaker were connected to the S-channel output terminal 15, the S-channel audio signal would be reproduced through this loudspeaker instead of through the right and left loudspeakers 7 and 9.

The novel multiple-channel audio reproduction apparatus in FIG. 2 can accordingly be used in systems equipped with two, three, or four loudspeakers to provide full-channel reproduction in all broadcast modes, including the 3-1 mode, regardless of the number of connected loudspeakers.

The invention is also applicable to multiple-channel audio reproduction apparatus having external amplifiers. Such an apparatus would be structured as in FIG. 1 without the amplifiers 3, 4, 5, and 6. In place of the C-channel and S-channel amplifiers 4 and 6, signal-generators would be provided to generate fixed output-check signals in response to the current-check command signals $S_1$ and $S_2$ during the interval T. The output terminals 12, 13, 14, and 15 could be connected to external amplifiers for driving loudspeakers.

Figure 3:
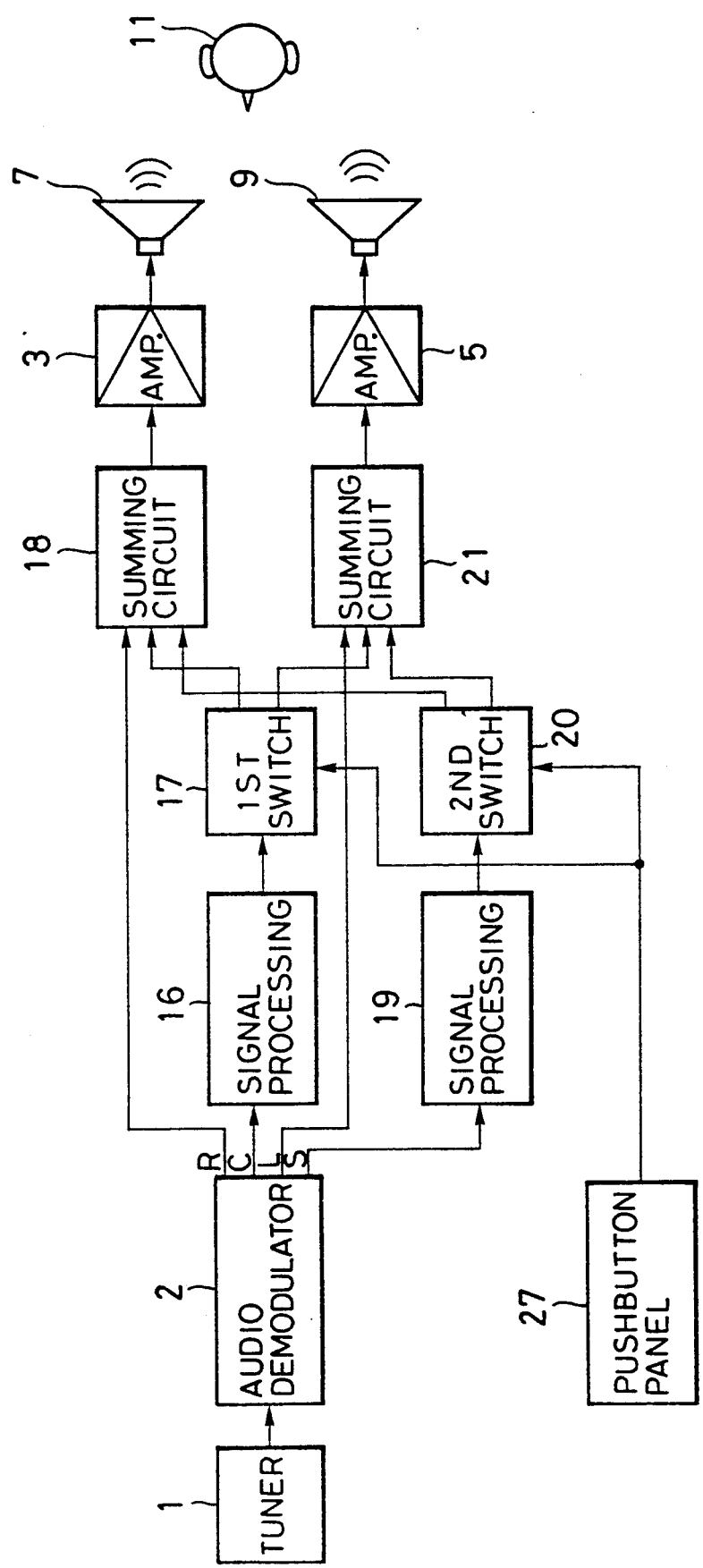
FIG. 3 is a block diagram illustrating a multiple-channel audio reproduction apparatus for a second embodiment of the present invention.

The second embodiment of the invention, illustrated in FIG. 3, has a tuner 1, an audio demodulator 2, first and second signal-processing circuits 16 and 19, first and second switches 17 and 20, first and second summing circuits 18 and 21, and R- and L-channel amplifiers 3 and 5 interconnected in the same way as in the first embodiment in FIG. 2. The outputs of the amplifiers 3 and 5 are connected to the right and left loudspeakers 7 and 9. For simplicity, only two amplifiers and loudspeakers are shown in the drawing, although amplifiers and loudspeakers for the C- and S-channels may also be present. The output terminals are not explicitly shown; they can be disposed on either side of the amplifiers, depending on whether the amplifiers are internal or external.

Figure 4:
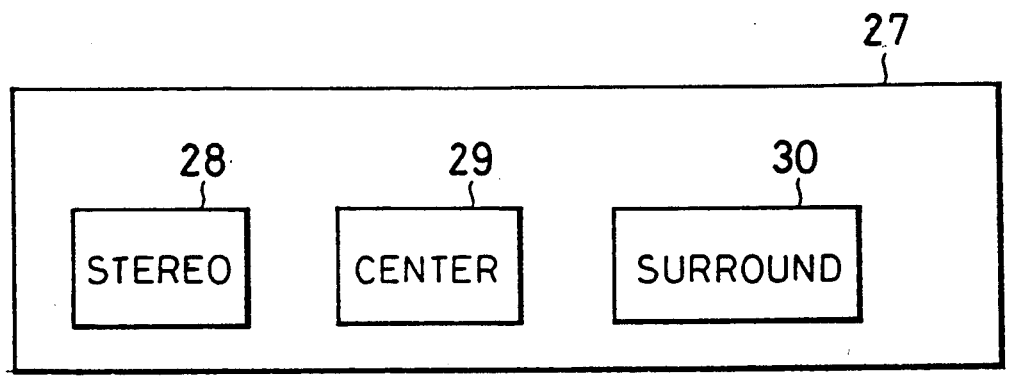
FIG. 4 shows a first arrangement of the pushbuttons in FIG. 3.

In the second embodiment the switch controller includes pushbuttons disposed on a pushbutton panel 27. With reference to FIG. 4, the pushbutton panel 27 has three buttons: a STEREO button 28, a CENTER button 29, and a SURROUND button 30. The STEREO button 28 controls the audio demodulator 2 by a signal line not explicitly shown in FIG. 3: when the STEREO button 28 is depressed, the R-channel and L-channel audio signals are sent separately to the first summing circuit 18 and the second summing circuit 21; when the STEREO button 28 is not depressed, the R-channel and L-channel audio signals are combined and the combined signal is sent to both the first summing circuit 18 and the second summing circuit 21. The STEREO button 28 is not a necessary part of the invention, but it is a common feature of multiple-channel audio reproduction apparatus, permitting monaural reproduction when only one loudspeaker is connected, or when stereo reproduction would be contaminated by excessive noise.

The CENTER button 29 controls the first switch 17: when the CENTER button 29 is depressed the first switch 17 is switched off, allowing the C-channel audio signal to be reproduced through a C-channel amplifier and loudspeaker; when the CENTER button 29 is not depressed, the first switch 17 is switched on and the C-channel audio signal is reproduced through the right and left loudspeakers 7 and 9. The SURROUND button 30 controls the second switch 20 and the S-channel audio signal in the same way.

The pushbutton panel 27 in FIG. 4 would normally be disposed on the front panel of the apparatus.

The second embodiment operates in the same way as the first except that it does not automatically detect whether C-channel and S-channel loudspeakers are connected each time power is switched on. Instead, the user designates the channels to which loudspeakers are connected when he sets up the system. Thus the same effect is obtained without the current-check circuitry required in the first embodiment, and without the need to allow an interval T between power-up and the start of audio reproduction.

Figure 5:
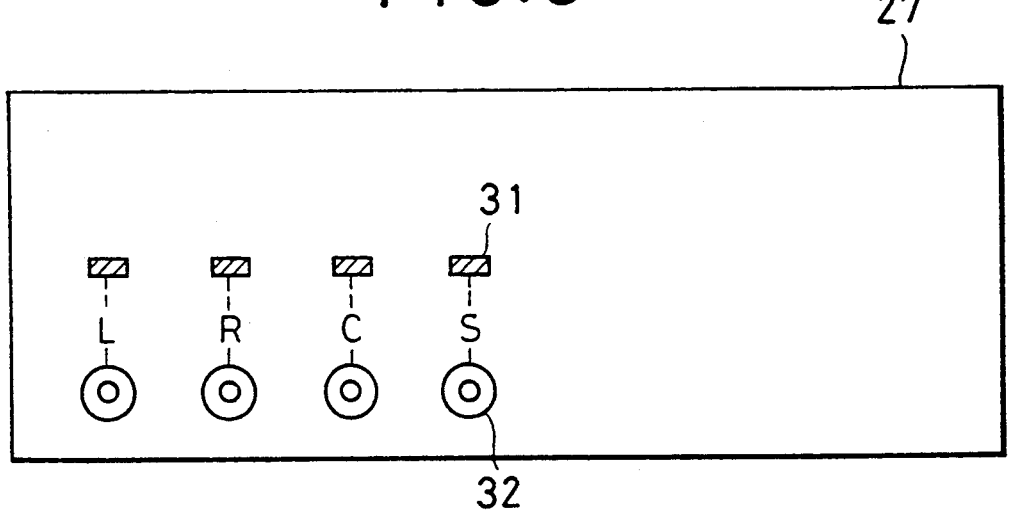
FIG. 5 shows a second arrangement of the pushbuttons in FIG. 3.

FIG. 5 illustrates another possible arrangement of the pushbutton panel 27, suitable for apparatus with external amplifiers. The pushbutton panel 27 in FIG. 5 includes four pushbuttons 31 disposed adjacent to amplifier jacks 32 for the L-, R-, C-, and S-channels. The user depresses the pushbutton 31 for each channel to which an amplifier and loudspeaker are connected. Alternatively, the pushbuttons 31 can be adapted to operate automatically when the pin of an amplifier cable is inserted into the corresponding amplifier jack 32.

Figure 6:
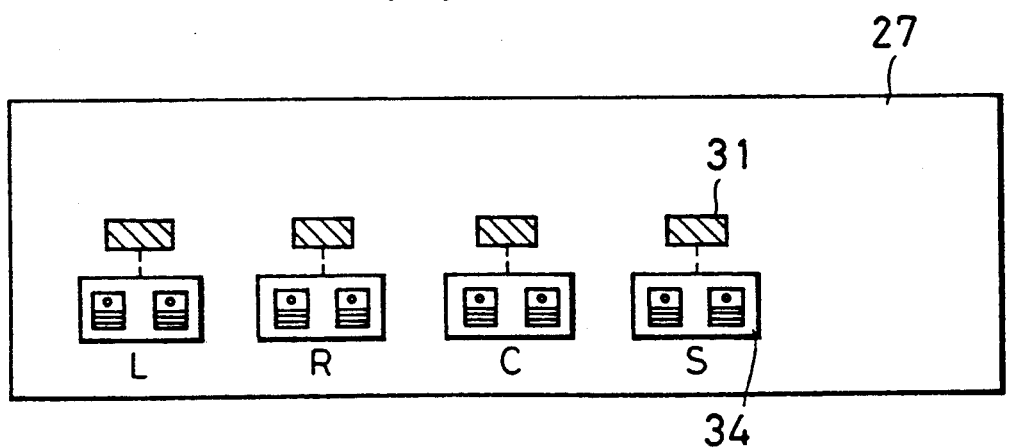
FIG. 6 shows a third arrangement of the pushbuttons in FIG. 3.

FIG. 6 illustrates still another possible arrangement of the pushbutton panel 27, suitable for apparatus with internal amplifiers. The pushbutton panel 27 in FIG. 6 includes four pushbuttons 31 disposed adjacent to loudspeaker jacks 32 for the L-, R-, C-, and S-channels, the amplifiers for these channels being built into the apparatus. The user depresses the pushbutton 31 for each channel to which a loudspeaker is connected.

The pushbutton panels and jacks in FIGS. 5 and 6 would normally be disposed on the rear panel of the apparatus.

The scope of this invention is not restricted to the structures shown in the drawings, but permits many modifications and variations that will be apparent to one skilled in the art. For example, at most one loudspeaker has been shown connected to each channel, but the invention is applicable to systems with more than one loudspeaker per channel. Furthermore, it is not necessary for the number of channels to be four, or for these four channels to be right, center, left, and surround channels; the invention is applicable to other multiple-channel schemes as well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A four-channel audio reproduction apparatus, comprising:

an audio demodulator for demodulating an input signal and producing right-channel, center-channel, left-channel, and surround-channel audio signals;

a right-channel output terminal for receiving said right-channel audio signal;

a center-channel output terminal for receiving said center-channel audio signal;

a left-channel output terminal for receiving said left-channel audio signal;

a surround-channel output terminal for receiving said surround-channel audio signal;

a first signal-processing circuit for processing said center-channel audio signal, said first signal-processing circuit outputting a processed center-channel audio signal for reproduction by loudspeakers connected to said right-channel output terminal and said left-channel output terminal;

a first switch connected to said first signal-processing circuit, for feeding the processed center-channel audio signal to said right-channel output terminal and said left-channel output terminal;

a second signal-processing circuit for processing said surround-channel audio signal, said second-processing circuit outputting a processed surround-channel audio signal for reproduction by loudspeakers connected to said right-channel output terminal and said left-channel output terminal;

a second switch connected to said second signal-processing circuit, for feeding the processed surround-channel audio signal to said right-channel output terminal and said left-channel output terminal; and switch controlling means for turning said first switch on if a loudspeaker fails to be connected to said center-channel output terminal, and otherwise turning said first switch off, and for turning said second switch on if a loudspeaker fails to be connected to said surround-channel output terminal, and otherwise turning said second switch off.

2. The apparatus of claim 1, wherein said right-channel, center-channel, left-channel, and surround-channel output terminals comprise amplifier jacks.

3. The apparatus of claim 1, wherein said right-channel, center-channel, left-channel, and surround-channel output terminals comprise loudspeaker jacks, and further comprising:
a right-channel amplifier connected between said audio demodulator and said right-channel output terminal, for amplifying said right-channel audio signal;
a center-channel amplifier connected between said audio demodulator and said center-channel output terminal, for amplifying said center-channel audio signal;
a left-channel amplifier connected between said audio demodulator and said left-channel output terminal, for amplifying said left-channel audio signal; and
a surround-channel amplifier connected between said audio demodulator and said surround-channel output terminal, for amplifying said surround-channel audio signal.

4. The apparatus of claim 1, wherein said first signal-processing circuit comprises a $1/\sqrt{2}$ attenuator.

5. The apparatus of claim 1, wherein said second signal-processing circuit comprises an attenuator and a phase inverter.

6. The apparatus of claim 1, wherein said switch controlling means comprises a first pushbutton connected to said first switch, and a second pushbutton connected to said second switch.

7. The apparatus of claim 6, wherein said pushbuttons are operated manually.

8. The apparatus of claim 6, wherein said pushbuttons are operated automatically by inserting pins of an amplifier cable in said center-channel output terminal and said surround-channel output terminal.

9. The apparatus of claim 6, wherein said pushbuttons are disposed adjacent to said center-channel output terminal and said surround-channel output terminal.

10. The apparatus of claim 1, wherein said switch controlling means comprises:
a current-check command circuit for generating a current-check command signal for a predetermined interval when power is switched on;
first signal-generating means connected to said current-check command circuit, for sending a first fixed signal to said center-channel output terminal in response to said current-check command signal;
a first current detection circuit connected to said current-check command circuit and said center-channel output terminal, for detecting current flow through said center-channel output terminal in response to said current-check command signal;
second signal-generating means connected to said current-check command circuit, for sending a second fixed signal to said surround-channel output terminal in response to said current-check command signal;
a second current detection circuit connected to said current-check command circuit and said surround-channel output terminal, for detecting current flow through said surround-channel output terminal in response to said current-check command signal; and
a switch control circuit connected to and activated by said current-check command circuit; said switch control circuit being also connected to said first current detection circuit, said first switch, said second current detection circuit, and said second switch; said switch control circuit for turning said first switch on if said first current detection circuit fails to detect current flow during said predetermined interval and otherwise turning said first switch off, and turning said second switch on if said second current detection circuit fails to detect current flow during said predetermined interval and turning said second switch off otherwise.

11. The apparatus of claim 10, wherein said first signal-generating means comprises a center-channel amplifier and said second signal-generating means comprises a surround-channel amplifier.

12. A method for reproducing four-channel audio signals, comprising the steps of:
(a) demodulating an input signal by an audio demodulator;
(b) developing right-channel, center-channel, left-channel and surround-channel audio signals from said input signal demodulated at said step (a);
(c) receiving said center-channel audio signal at a center-channel output terminal;
(d) receiving said right-channel audio signal at a right-channel output terminal;
(e) receiving said left-channel audio signal at a left-channel output terminal;

(f) receiving said surround-channel audio signal at a surround-channel output terminal;

(g) processing said center-channel audio signal to output a processed center-channel audio signal for reproduction by loudspeakers connected to said right-channel output terminal and said left-channel output terminal by a first signal processing circuit connected to said audio demodulator;

(h) feeding said processed center-channel audio signal at said step (g) to said right-channel output terminal and said left-channel output terminal by a first switch connected to said first signal processing circuit;

(i) processing said surround-channel audio signal to output a processed surround-channel audio signal for reproduction by loudspeakers connected to said right-channel output terminal and said left-channel output terminal by a second signal processing circuit connected to said audio demodulator;

(j) feeding said processed surround-channel audio signal at said step (i) to said right-channel output terminal and said left-channel output terminal by a second switch connected to said second signal processing circuit;

(k) turning said first switch on if a loudspeaker fails to be connected to said center-channel output terminal and otherwise turning said first switch off; and (l) turning said second switch on if a loudspeaker fails to be connected to said surround-channel output terminal and otherwise turning said second switch off.

13. The method of claim 12, further comprising the steps of:

(m) amplifying said right-channel audio signal by a right-channel amplifier connected between said audio demodulator and said right-channel output terminal;

(n) amplifying said center-channel audio signal by a center-channel amplifier connected between said audio demodulator and said center-channel output terminal;

(o) amplifying said left-channel audio signal by a left-channel amplifier connected between said audio demodulator and said left-channel output terminal; and (p) amplifying said surround-channel audio signal by a surround-channel amplifier connected between said audio demodulator and said surround-channel output terminal.

14. The method of claim 12, further comprising the steps of:

(m) generating a current-check command signal for a predetermined interval by a current-check check command circuit when power is switched on;

(n) sending a first fixed signal to said center-channel output terminal in response to said current-check command signal by first signal-generating means connected to said current-check command circuit;

(o) detecting current flow through said center-channel output terminal in response to said current-check command signal by a first current detection circuit connected to said current-check command circuit and center-channel output terminal;

(p) sending a second fixed signal to said surroud-channel output terminal in response to said current-check command signal by second signal-generating means connected to said current-check command circuit;

(q) detecting current flow through said surround-channel output terminal in response to said current-check command signal by a second current detection circuit connected to said current-check command circuit and said surround channel output terminal; and (r) turning said first switch on if said first current detection circuit fails to detect current flow during said predetermined interval and turning said first switch off otherwise, and turning said second switch on if said second current detection circuit fails to detect current flow during said predetermined interval and turning said second switch off otherwise by a switch control circuit connected to and activated by said current-check command circuit said switch control circuit being, also connected to said first current detection circuit, said first switch, said second current detection circuit and said second switch.

15. A multiple-channel audio reproduction apparatus, comprising:

an audio demodulator for demodulating an input signal and producing first-channel, second-channel and third-channel audio signals;

a first-channel output terminal for receiving said first-channel audio signal;

a second-channel output terminal for receiving said second-channel audio signal;

a third-channel output terminal for receiving said third-channel audio signal;

a signal-processing circuit for processing said third-channel audio signal, said signal-processing circuit outputting a processed third-channel audio signal; for reproduction by loudspeakers connected to said first-channel output terminal and said second-channel output terminal;

a switch connected to said signal-processing circuit, for feeding the processed third-channel audio signal to said first-channel output terminal and said second-channel output terminal; and switch controlling means for turning said switch on if a loudspeaker fails to be connected to said third-channel output terminal, and otherwise turning said switch off.

16. A method for reproducing multiple-channel audio signals, comprising the step of:

(a) demodulating an input signal by an audio demodulator;

(b) developing first channel, second channel and third channel audio signals from said input signal demodulated at said step (a);

(c) receiving said first-channel audio signal at a first-channel output terminal;

(d) receiving said second-channel audio signal at a second-channel output terminal;

(e) receiving said third-channel audio signal at a third-channel output terminal;

(f) processing said third-channel audio signal to output a processed third-channel audio signal for reproduction by loudspeakers connected to said first-channel output terminal and said second-channel output terminal by a signal processing circuit connected to said audio demodulator;

(g) feeding said processed third-channel audio signal at said step (f) to said first-channel output terminal and to said second-channel output terminal by a switch connected to said signal processing circuit; and (h) turning said switch on if a loudspeaker fails to be connected to said third-channel output terminal and otherwise turning said switch off.

17. The method of claim 16, further comprising the steps of:
(i) generating a current-check command signal for a predetermined interval by a current-check command circuit when power is switched on;
(j) sending a fixed signal to said third-channel output terminal in response to said current-check command signal by signal-generating means connected to said current-check command circuit;
(k) detecting current flow through said third-channel output terminal in response to said current-check command signal by a first current detection circuit connected to said current-check command circuit and said third-channel output terminal; and
(l) turning said switch on if said current detection circuit fails to detect current flow during said predetermined interval and turning said switch off otherwise by a switch control circuit connected to and activated by said current-check command circuit, said switch control circuit also being connected to said current detection circuit and said switch.

* * * * *